(12) United States Patent
Jin

(10) Patent No.: US 6,266,801 B1
(45) Date of Patent: Jul. 24, 2001

(54) BOUNDARY-SCAN CELLS WITH IMPROVED TIMING CHARACTERISTICS

(75) Inventor: London Jin, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/153,634

(22) Filed: Sep. 15, 1998

(51) Int. Cl.[7] .................................................. G06F 17/50
(52) U.S. Cl. ........................... 716/8; 716/2; 716/6; 716/4
(58) Field of Search ..................................................... 716/8

(56) References Cited

U.S. PATENT DOCUMENTS

| | | | |
|---|---|---|---|
| 5,084,874 | * 1/1992 | Whetsel, Jr. | 371/22.3 |
| 5,347,520 | * 9/1994 | Simpson et al. | 371/22.3 |
| 5,355,369 | * 10/1994 | Greenberger | 371/22.3 |
| 5,513,186 | * 4/1996 | Levitt | 371/22.3 |
| 5,519,355 | * 5/1996 | Nguyen | 327/565 |
| 5,627,839 | * 5/1997 | Whetsel | 371/22.3 |
| 5,631,911 | * 5/1997 | Whetsel, Jr. | 371/22.3 |
| 5,706,296 | * 1/1998 | Whetsel | 371/22.3 |
| 5,710,779 | * 1/1998 | Whetsel | 371/22.3 |
| 5,715,255 | * 2/1998 | Whetsel | 371/22.3 |
| 5,732,091 | * 3/1998 | Whetsel | 371/22.3 |
| 5,768,289 | * 6/1998 | James | 371/22.32 |
| 5,847,561 | * 12/1998 | Whetsel | 324/158.1 |
| 5,872,908 | * 2/1999 | Whetsel | 395/183.06 |
| 5,880,595 | * 3/1999 | Whetsel | 326/16 |
| 5,883,524 | * 3/1999 | Whetsel | 326/16 |
| 5,894,483 | * 4/1999 | Kaminski | 371/24 |
| 5,938,783 | * 8/1999 | Whetsel | 714/726 |
| 5,983,377 | * 11/1999 | Knotts | 714/726 |
| 6,071,314 | * 6/2000 | Baxter et al. | 716/17 |

OTHER PUBLICATIONS

L. Whetsel, Improved Boundary Scan Design, International Test Conference, pp. 851–860, Oct. 1995.*

B. Pouya et al., Modifying User–Defined Logic for Test Access to Embedded Cores, International Test Conference, pp. 60–68, Nov. 1997.*

L. Whetsel, A Standard Test Bus & Boundary Scan Architecture, TI Technical Journal, pp. 48–59, Jul. 1988.*

IEEE Inc., IEEE Standard Text Access Port and Boundary Scan Architecture (IEEE Std. 1149.1–1990), section 5, Oct. 1993.*

P. Gillis et al., Delay Test of Chip I/Os Using LSSD Boundary Scan, International Test Conference, pp. 83–90, Aug. 1998.*

S. Narayanan et al., Configuring Multiple Scan Chains for Minimum Test Time, 1992 IEEE/ACM Conference on Computer Aided Design, pp. 4–8, Nov. 1992.*

D. Braune et al., ASIC Design for Testability, IEEE ASIC Seminar and Exhibit, pp. 1.1–1.10, Sep. 1989.*

R. Burgess et al., The Boundary Scan, IEEE Potentials, pp. 11–12, Aug. 1995.*

* cited by examiner

Primary Examiner—Matthew Smith
Assistant Examiner—A. M. Thompson
(74) Attorney, Agent, or Firm—Martine & Penilla, LLP

(57) ABSTRACT

Disclosed is an integrated circuit design having boundary scan cells for enabling JTAG mode testing while providing a predictability in determining the load of Q in a functional mode. The design is also configured to reduce adverse timing impacts of conventional boundary scan cells. The design is therefore well suited to communicate with a plurality of tri-state output buffers that are configured to receive a control signal and a data signal from an associated one of the plurality of data output boundary scan cells. In integrating this design, the predictability in the load of Q in the functional mode is therefore defined by N+1, where "N" is the load associated with the plurality of data output boundary scan cells and "1" is the load associated with the control boundary scan cell.

23 Claims, 6 Drawing Sheets

Before BS Cell Insertion

After BS Cell Insertion

Control BS Cell

Before BS Cell Insertion

After BS Cell Insertion

BOUNDARY-SCAN CELLS WITH IMPROVED TIMING CHARACTERISTICS

BACKGROUND OF THE INVENTION

1. Field of the Invention

This invention relates generally to integrated circuits and more particularly concerns boundary-scan cell designs with improved timing characteristics.

2. Description of the Related Art

Electronic systems typically have one or more printed circuit boards (PCB's) and one or more integrated circuit (IC) chips. IC chips typically include input/output pins (I/O pins) that are commonly coupled to interconnects of a PCB. Testing the performance of electronic systems, which include PCB's and IC chips typically require testing at chip level, at board level, and at system level. Testing at board level includes testing interconnects of the PCB. Testing at system level includes analysis of interconnections between IC chips, PCB's, and other devices.

In order to enhance the testability at board-level and system-level, a common design practice at chip-level now consists of incorporating IEEE Standard 1149.1 logic, or JTAG (Joint Test Action Group). In order to build JTAG logic, boundary-scan (BS) cells are inserted for all I/Os and control (enable) signals Q for tri-state outputs in chip design. As a simplistic illustration, FIG. 1A shows a partial circuit design 10 including a core 12 that communicates with input/output logic to establish a path to a pin 18. The core can therefore communicate data to a tri-state output buffer 14, and also communicate data into the core 12 via an input buffer 16.

FIG. 1B shows a partial circuit design 10' after boundary scan (BS) cells have been inserted to convert the circuit design into a JTAG testable circuit. In this example, three types of boundary scan (BS) cells 20, 22, and 24 are used to accomplish control, output, and input, respectively. FIG. 1C provides a more detailed logic level diagram of the control BS cell 20. The control BS cell 20 includes a multiplexer (mux m1) 26, a flip flop 28, a latch 30, and a multiplexer (mux m2) 32. In this design, the multiplexer 32 functions as the mode control logic. Therefore, when Mode=0, the core 12 will be able to communicate with the I/O pad 18, and therefore establish the functional path. Alternatively, when Mode=1, the JTAG path will be established to enable boundary scan testing (under JTAG mode).

FIG. 1D illustrates another example in which the core 12 communicates to input/output circuitry (in a multiple bit case) that includes tri-state output buffers 14 and input buffers 16. In this example, the signal coming from the core 12 is shown to be an enable signal (enable_net) that provides the control signals 34 to the various tri-state output buffers 14 in the circuit design. When the core 12 is designed in a particular integrated circuit device, the designer takes into consideration the amount of drive strength required to drive the enable control signal 34, depending upon the number of tri-state output buffers leading to input/output pads 18.

FIG. 1E illustrates the insertion of a control BS cell 20 into the design of FIG. 1D. In this example, the enable signal 34 is now only communicated to the single load of the multiplexer (mux m2) 32, as opposed to delivering the enable signal 34 to each load of the tri-state output buffers 14. A critical drawback of this design is that the drive strength designed into the core logic 12 was initially set to drive a plurality of tri-state output buffers 14 as shown in FIG. 1D, not a single multiplexer.

Consequently, the output drive strength provided by the enable signal 34 to the multiplexer 32 will produce a severe overdriving. As is well known, severe consequences such as, greater heat dissipation, greater power consumption, and greater current will necessarily result from this overdriving. In some cases, the multiplexer 32 may be overdriven so much that it will become damaged and therefore jeopardize the functionality of the chip in both the functional mode and in the test mode. Another disadvantage of having too much drive strength delivered to the multiplexer 32 is that the core 12 was initially designed with more logic to drive the plurality of tri-state output buffers 14, and now the silicon area used for that extra drive strength will, in essence, be wasted. As a result, the design and fabrications costs of the IC will be much greater than required.

Although the core logic can be redesigned to reduce the drive strength when JTAG testability is needed, such laborious redesign is generally not recommended. This is because the logic designer has already optimized the core logic 12 in terms of timing to meet the desired IC specification. When the core logic is subsequently modified to reduce the driving strength provided to the multiplexer 32, the timing parameters optimized for the entire integrated circuit design may become offset. Of course, such redesign can be performed while at the same time modifying the timing parameters of the integrated circuit device, but such redesign may be very time consuming, and therefore, greatly increase the cost of the IC due to the incorporation of basic JTAG logic.

Even though the multiplexer 32 is provided with a larger drive strength than necessary after the insertion of the control BS cell 20 in FIG. 1E, the multiplexer 32 on its own is a very weak driver. Consequently, the drive strength provided by the multiplexer 32 to each of the tri-state output buffers 14 may be weaker than is actually required. One technique used to increase the drive strength of the signal provided from the output of the multiplexer 32 is to include an additional buffer 37 just before driving the tri-state output buffers 14.

Although this achieves the desired greater drive strength, the introduction of the output buffer 37 will have the disadvantage of introducing a "gate delay" and "write delay" that are in addition to the "one-mux" delay produced by the multiplexer 32. Although only 4 input/output pads 18 are shown in FIG. 1E, in designs where the multi-bit count is high, a larger degree of buffering will be needed in order to provide the signal output by the multiplexer 32 with sufficient drive strength. Accordingly, as more buffering is needed at the output of the multiplexer 32, more timing alterations will be introduced. Of course, anytime the delays are introduced along the functional path (identified herein by darker signal paths), the more likely it will be that the IC will no longer function under its proper timing specification.

Accordingly, although adding boundary scan cells to achieve testability is highly desirable, the insertion of boundary scan cells into IC designs introduces substantial disadvantages in terms of the aforementioned overdriving problems and timing problems. These problems may therefore prevent the integrated circuit device from properly operating at a desired frequency in functional mode (also known as system mode).

In view of the foregoing, there is a need for boundary scan circuitry that can be easily incorporated into integrated circuit designs without impacting upon the circuits' timing characteristics. Additionally, there is a need for boundary scan circuitry that can be inserted into existing designs while at the same time, providing the designer incorporating the boundary scan cells with a predictable level of load on Q during functional mode operation.

SUMMARY OF THE INVENTION

Broadly speaking, the present invention fills these needs by providing new and improved integrated circuit boundary scan cells that substantially eliminate timing problems and overdriving problems in single and multiple bit applications. It should be appreciated that the present invention can be implemented in numerous ways, including as a process, an apparatus, a system, a device, or a method. Several inventive embodiments of the present invention are described below.

In one embodiment, an integrated circuit design incorporating boundary scan cells having improved timing characteristics is disclosed. The design includes a control boundary scan cell that is configured to receive a core circuitry output signal (enable) at a first multiplexer of the control boundary scan cell, and generate an output signal from a latch of the control boundary scan cell. A data output boundary scan cell is also included having a third multiplexer (e.g., FIG. 4 mix m3 122). The third multiplexer is also configured to receive the core circuitry output signal (enable), the output signal from the latch of the control boundary scan cell, and then output a control signal. The data output boundary scan cell also includes a second multiplexer (e.g., FIG. 4 mux m2 130) that is configured to generate a data output. The design further includes a tri-state output buffer that is configured to receive both the data output from the second multiplexer and the control signal from the third multiplexer. In multi-bit cases, the data output boundary scan cell is replicated for each one of the tri-state output buffers, while the single control boundary scan cell communicates an output to each of the data output boundary scan cells. This therefore produces a much needed level on predictability in the load of Q in the functional mode, which will preferably be N+1, where N equals the number of tri-state output buffers (or output stages) and "1" is the load of the single control boundary scan cell.

In another embodiment, an integrated circuit design having boundary scan cells for enabling JTAG mode testing while providing a predictability in the load on Q in a functional mode is disclosed. The design is also configured to reduce the adverse timing impacts experienced in the prior art. The design includes a control boundary scan cell that has an input that is connected to an enable signal which is communicated from a core of the integrated circuit design. The control boundary scan cell is further configured to generate an output signal. The design then includes a plurality of data output boundary scan cells. Each of the plurality of data output boundary scan cells includes a multiplexer (e.g., mux 122) that has a first input connected to the enable signal and a second input that is connected to the output signal from the control boundary scan cell. The design is therefore well suited to communicate with a plurality of tri-state output buffers that are configured to receive a control signal and a data signal from an associated one of the plurality of data output boundary scan cells. In integrating this design, the predictability in the load on Q in the functional mode is therefore defined by N+1, where "N" is the load associated with the plurality of data output boundary scan cells (i.e., the mux's 122) and "1" is a load associated with the control boundary scan cell.

In still another embodiment a method for making an integrated circuit device having boundary scan cells for enabling JTAG mode testing while providing a predictability in a load on Q in a functional mode is disclosed. The method includes designing a control boundary scan cell that has an input that is connected to an enable signal which is communicated from a core of the integrated circuit design. The control boundary scan cell is further configured to generate an output signal. The method then includes designing a plurality of data output boundary scan cells. Each of the plurality of data output boundary scan cells includes a multiplexer that has a first input connected to the enable signal and a second input that is connected to the output signal from the control boundary scan cell.

The inventive embodiments of the present invention, therefore provide circuit designs and method for making circuit designs for use in generating JTAG mode enabling logic. The boundary scan cell designs of the present invention solve the much desired need of preventing: (a) overdriving of boundary scan cell logic, (b) the waste in power consumption and current drive, and (c) timing inconsistencies when delays are added to increase the drive of outputting multiplexers. In addition, the present invention now provides designers with a high level of predictability in the load on Q when in the functional mode, since it is always increased by one (i.e., N+1). Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a new and improved integrated circuit boundary scan cells that substantially eliminate timing problems and overdriving problems in single and multiple bit applications. By substantially over eliminating the overdriving problems of the prior art, the over consumption of power and current, and associated heat dissipation will advantageously be reduced. Additionally, the boundary scan cell designs of the present invention will provide designers with a needed level of predictability in identifying the actual load requirements on Q in the functional mode. It will be obvious, however, to one skilled in the art that the present invention may be practiced without some or all of these specific details. In other instances, well known process operations have not been described in detail in order not to unnecessarily obscure the present invention.

For more information on JTAG related logic circuitry and associated JTAG mode testing, reference may be made to a commonly assigned U.S. patent application having Ser. No. 08/951,987, entitled "HIGH SPEED BOUNDARY SCAN DESIGN", and filed on Oct. 16, 1997. This application is hereby incorporated by reference. The following FIGS. 2 through 5C will now be described in order to clearly describe the various embodiments and advantages of the present invention.

Figure 2:
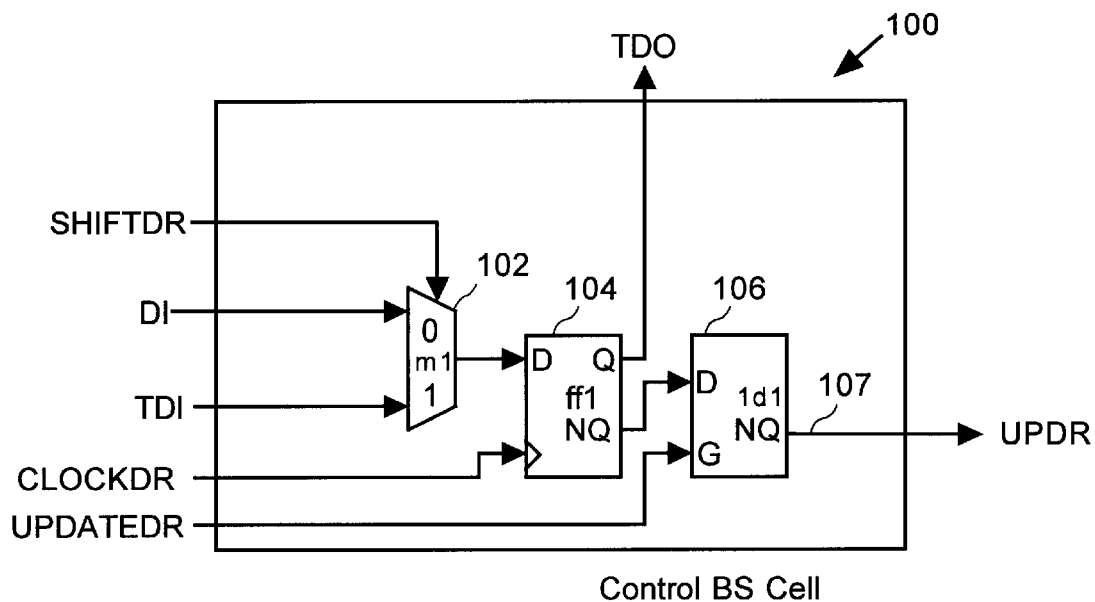
FIG. 2 illustrates a control boundary scan (BS) cell in accordance with one embodiment of the present invention.

FIG. 2 illustrates a control boundary scan (BS) cell 100 in accordance with one embodiment of the present invention. As shown, the control boundary scan cell 100 includes a multiplexer (mux m1) 102, a flip flop 104, and a latch 106. The multiplexer 102 is configured to receive a control signal SHIFTDR and input signals of DI and TDI (i.e., a test data input). The output of the multiplexer 102 is then fed into the D input of the flip flop 104, which also receives a clock signal from CLOCKDR. The flip flop 104 is also capable of generating a signal TDO (i.e., test data output) and an inverted output to the D terminal of the latch 106. The latch 106 is also capable of receiving an UPDATEDR signal at the G terminal and output an UPDR signal from the inverted Q output to define a signal 107.

Figure 3:
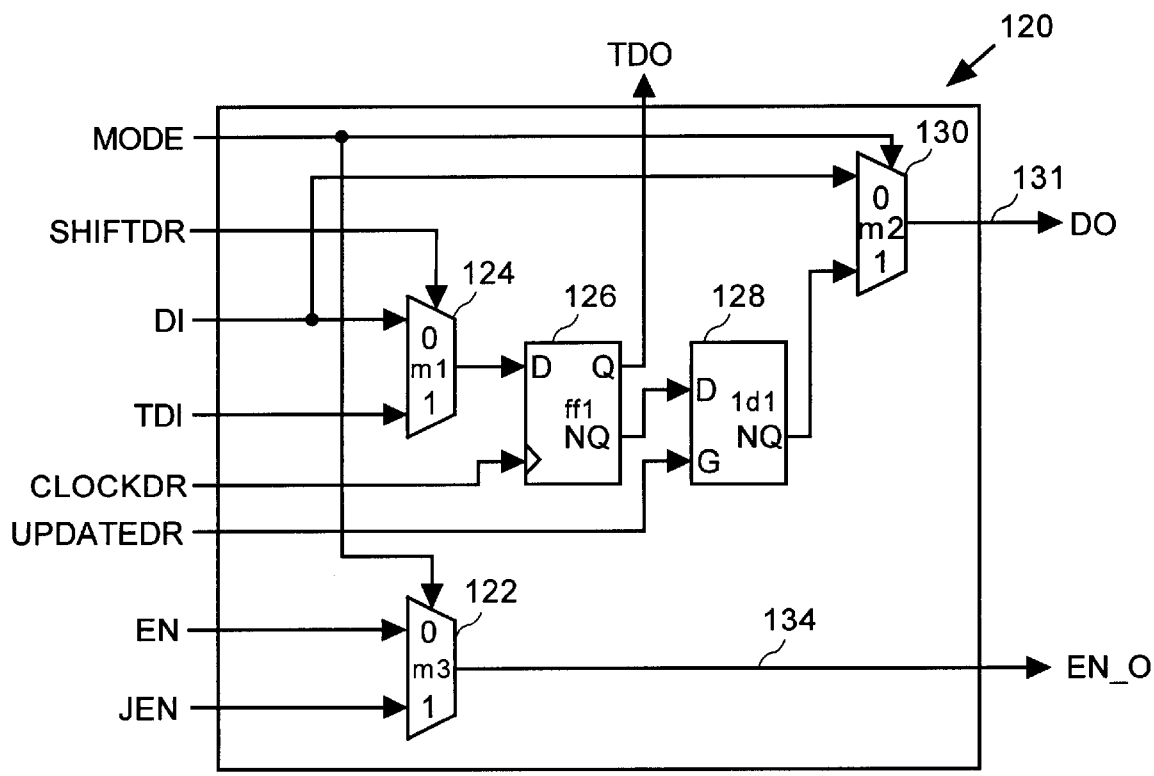
FIG. 3 illustrates a data output BS cell in accordance with one embodiment of the present invention.

FIG. 3 illustrates a data output BS cell 120 in accordance with one embodiment of the present invention. The data output BS cell 120 is preferably configured to work in conjunction with the control BS cell 100 when communicating to a particular tri-state output buffer 114, as will be described below with respect to FIG. 4. In this embodiment, the data output BS cell includes a multiplexer (mux m1) 124, a flip flop 126, a latch 128, a multiplexer (mux m2) 130, and a multiplexer (mux m3) 122.

As shown, the MODE signal is provided as a control signal to both the multiplexer 130 and the multiplexer 122. The SHIFTDR is provided as a control signal to the multiplexer 124, and the multiplexer 124 is configured to receive a DI signal and a TDI signal as inputs. The DI signal is also simultaneously provided to the multiplexer 130. A CLOCKDR is provided to the flip flop 126, and an UPDATEDR signal is provided to the latch 128 at a toggle G. The output of the latch 128 is therefore capable of being communicated to the multiplexer 130, which in turn is configured to output a signal 131 to DO. Furthermore, the multiplexer 122 is shown having inputs of EN and JEN, and an output of EN_0 at signal 134.

Figure 4:
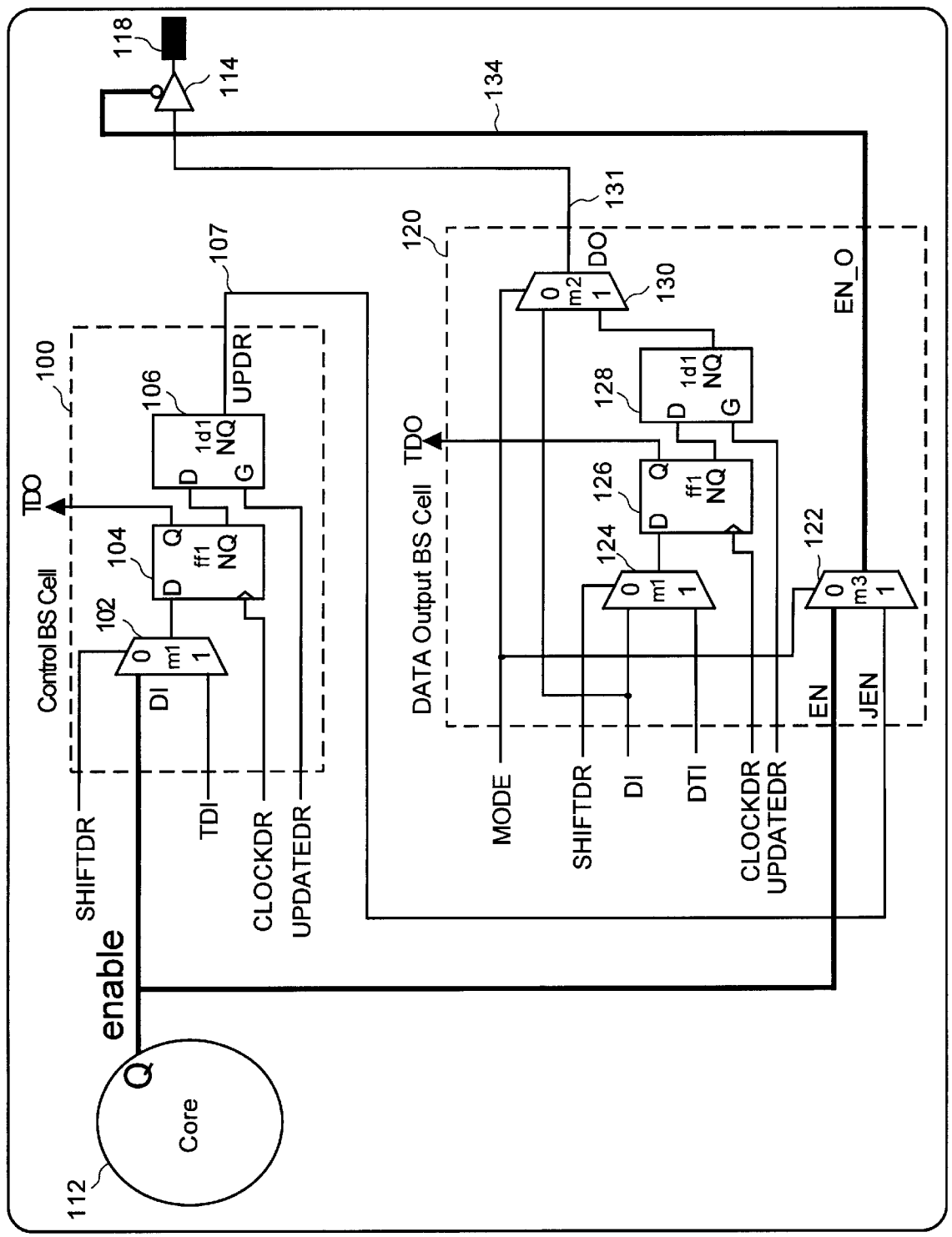
FIG. 4 illustrates an example of the boundary scan cells of FIGS. 2 and 3 integrated between a core and a tri-state output buffer, in accordance with one embodiment of the present invention.

FIG. 4 now illustrates an example of the boundary scan cells of FIGS. 2 and 3 integrated between the core 112 and a tri-state output buffer 114, in accordance with one embodiment of the present invention. The enable signal from the core 112 is now communicated to the multiplexer 102 of the control boundary scan cell 100, and to the multiplexer 122 of the data output boundary scan cell 120. The output of the multiplexer 130 now provides the signal 131 to the input of the tri-state output buffer 114, and the output of the multiplexer 122 provides the signal 134 directly to the control of the tri-state output buffer 114.

As an advantage, the multiplexer 122 of the data output boundary scan cell 120 is now configured to drive a single control signal 134 to one tri-state output buffer 114. However, the core 112 will also have to drive one additional multiplexer, which is the multiplexer 102 of the control boundary scan cell 100. Thus, after insertion of the boundary scan cells of the present invention, the load on Q in the functional mode will always be increased by "1." That is, if there are N tri-state output buffers 114, the load on Q in the functional mode will always be N+1. As a result of this predictability, the problems of overdriving a single multiplexer, which in turn may have to drive to multiple tri-state output buffers 114, will be eliminated. Accordingly, the drive strength provided by the core 112 of FIG. 4 can now be well tailored to drive the loads of the multiplexers 102 and 122, and the multiplexers 102 and 122 will in turn be well suited to drive the single tri-state output buffer 114 (in this one-bit example).

In this embodiment of the present invention, each time an additional tri-state output buffer 114 is needed in a multi-bit design, an additional data output boundary scan cell 120 will be included. Therefore, each tri-state output buffer 114 will be driven by its own multiplexer 122. To illustrate the much needed predictability of the load on Q in the functional mode, reference will now be made to FIGS. 5A through 5C.

Figure 5A:
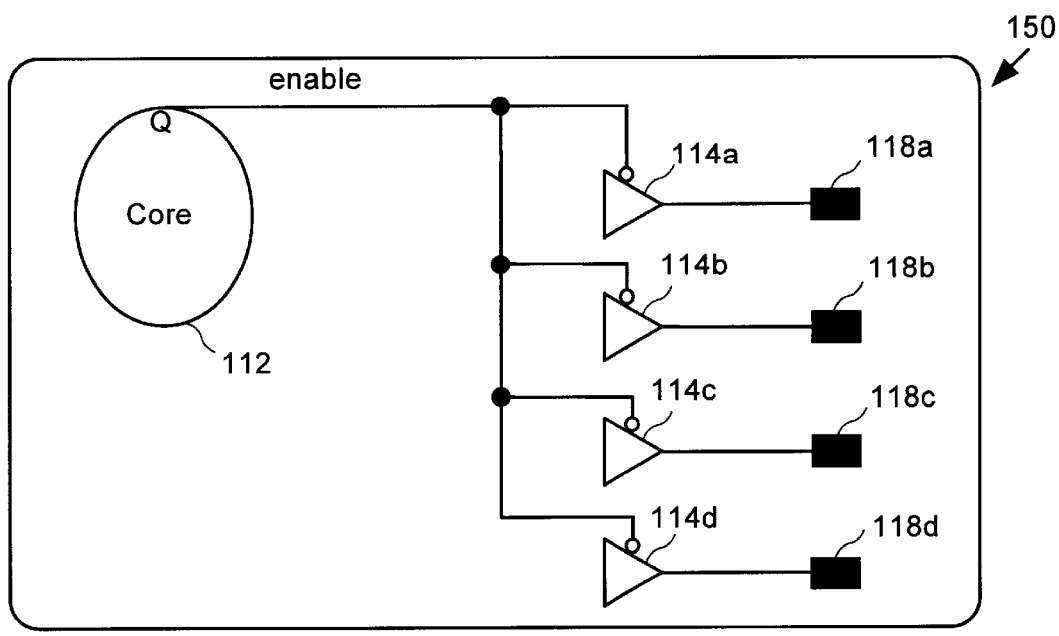
FIG. 5A illustrates a circuit diagram where no boundary scan cells are incorporated between the core and the input/output circuitry.

FIG. 5A illustrates a circuit diagram 150 where no boundary scan cells are incorporated between the core 112 and the input/output circuitry. As mentioned above, when the core 112 is designed, careful consideration is taken to account for the number of output cells that will ultimately be driven to associated input/output pads 118. In the example of FIG. 5A, four exemplary input/output pads 118 are shown (i.e., 118 through 118d). Therefore, the drive strength of the integrated circuitry that is ultimately fabricated into the core 112 is designed such that the enable signal will be able to drive four separate tri-state output buffers 114a through 14d. However, as described with reference to the prior art, when boundary scan cells are incorporated, the enable signal will overdrive the multiplexer 32, because the drive strength is set for driving all 4 output stages.

Unfortunately, that overdriving provided by the core 112 will induce higher power consumption, more current consumption, and higher heat dissipation. In today's compact and high efficiency integrated circuit designs, any waste in power or increased heat dissipation has the downside of affecting performance, and therefore limiting the IC's applicability to electronics requiring low power consumption.

Figure 5B:
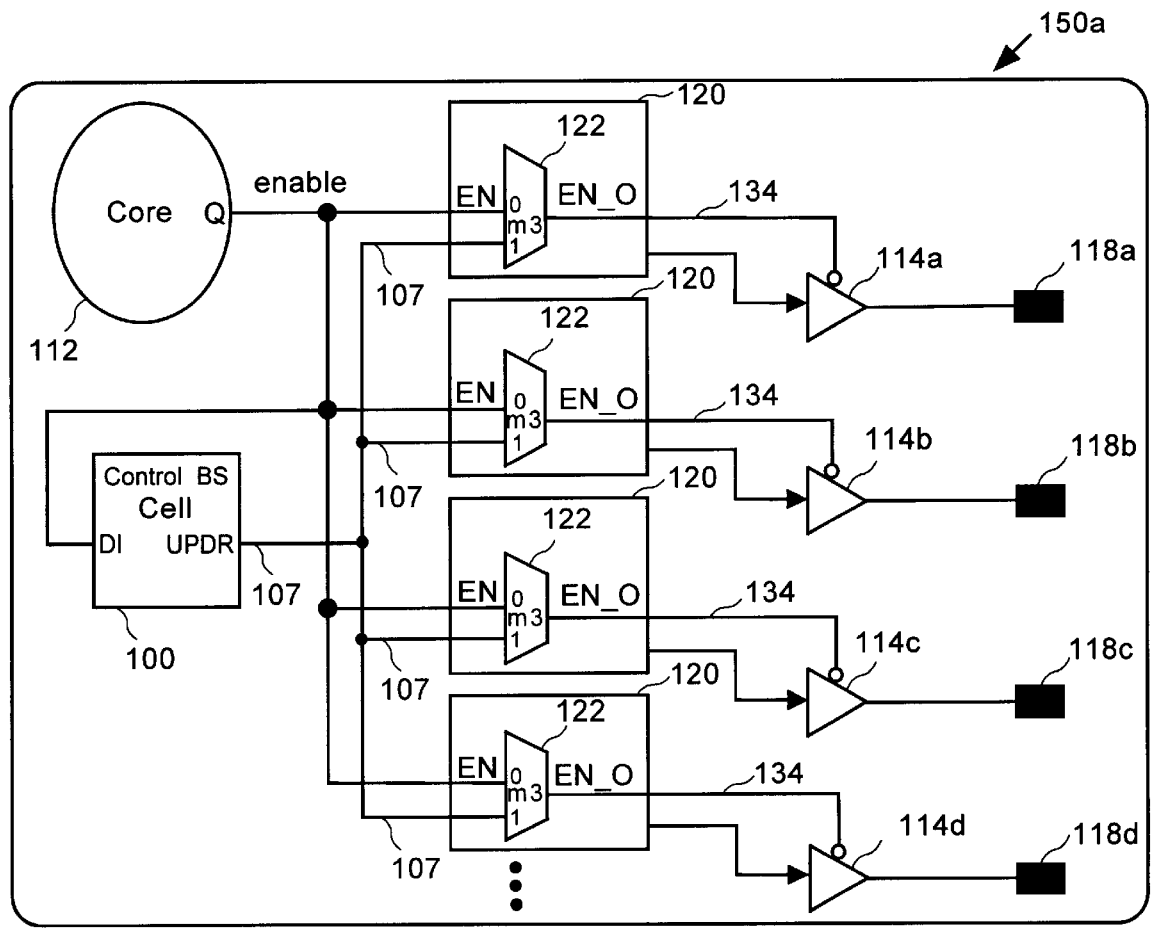
FIG. 5B illustrates circuitry that incorporates the inventive control boundary scan cell and associated data output boundary scan cells for multiple bit applications, in accordance with one embodiment of the present invention.

FIG. 5B illustrates circuitry 150a that incorporates the inventive control boundary scan cell 100 and associated data output boundary scan cells 120 for a multiple bit applications, in accordance with one embodiment of the present invention. As mentioned above, when the core circuitry 112 is initially designed, it is designed to drive a certain number of output stages. As in the example of FIG. 5B, there are four output stages, and therefore the design of the integrated circuitry of the core 112 will take this into consideration when designing the output drive circuitry.

By implementing the inventive boundary scan cells of the present invention, the enable signal provided by the core 112 may be designed with exact load predictability. This is because the load on Q in the functional mode will always be the number of output states "N" plus "1" for the load of the control boundary scan cell 100. As a further advantage, each of the multiplexers 122 will only have to drive a single tri-state output buffer 114. Because of this advantageous feature, there will generally be no need to add additional buffers at the outputs of the multiplexers 122 in order to increase the driving strength in functional mode. Because these additional buffers are not needed, the timing problems introduced by the additional gate delays are eliminated.

Accordingly, if the designers of an IC know that JTAG testing logic is desired, the drive strength can be exactly optimized to drive N+1 loads, where "N" is the number of output stages. The embodiments of the present invention therefore add a very advantageous level of predictability on what the load of Q in the functional mode will be if JTAG logic is implemented.

Figure 1A:
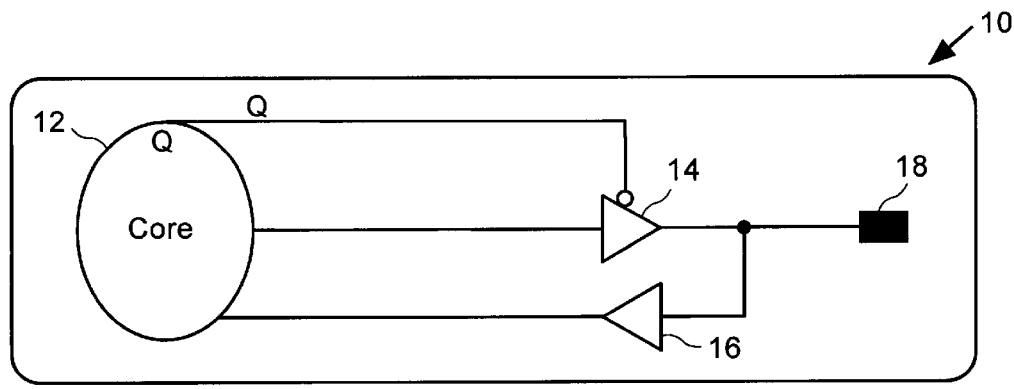
FIG. 1A shows a non-JTAG partial circuit diagram including a core that communicates with input/output logic to establish a path to an I/O pin.
Figure 1B:
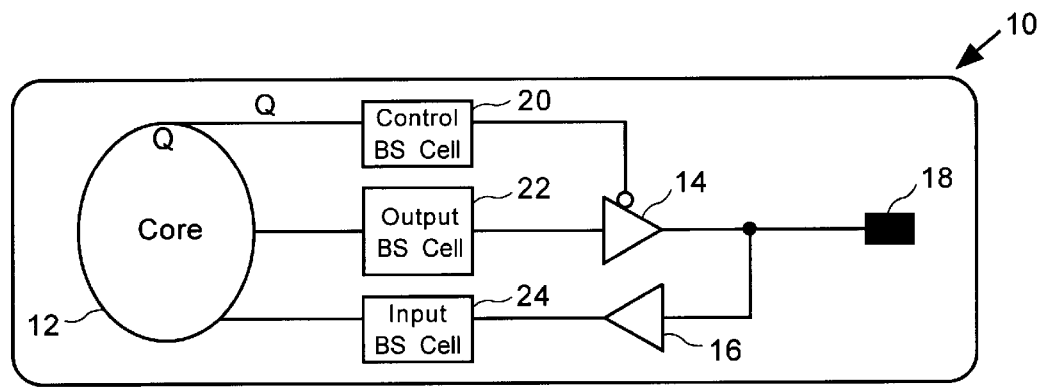
FIG. 1B shows the partial circuit diagram of FIG. 1A after boundary scan (BS) cells have been added to enable JTAG mode testing.
Figure 1C:
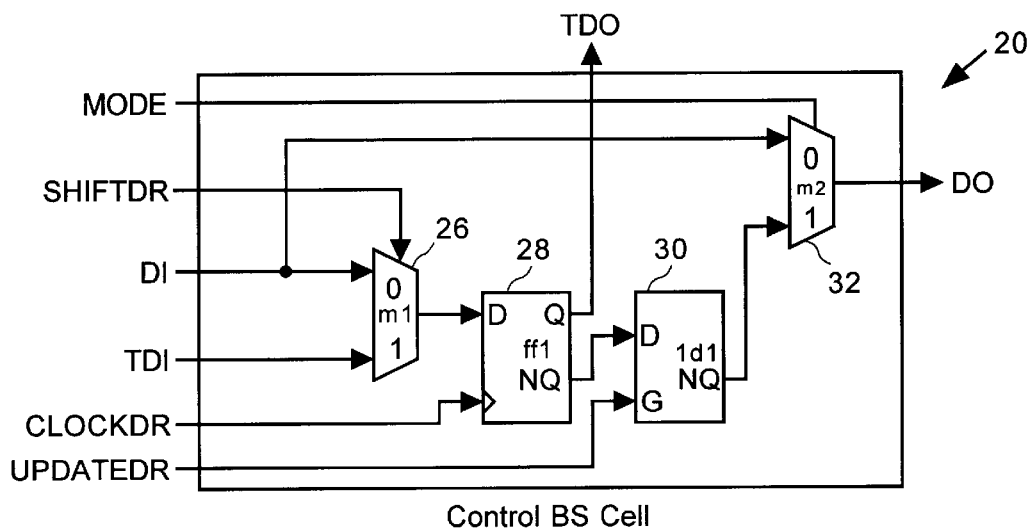
FIG. 1C provides a more detailed logic level diagram of a control BS cell.
Figure 1D:
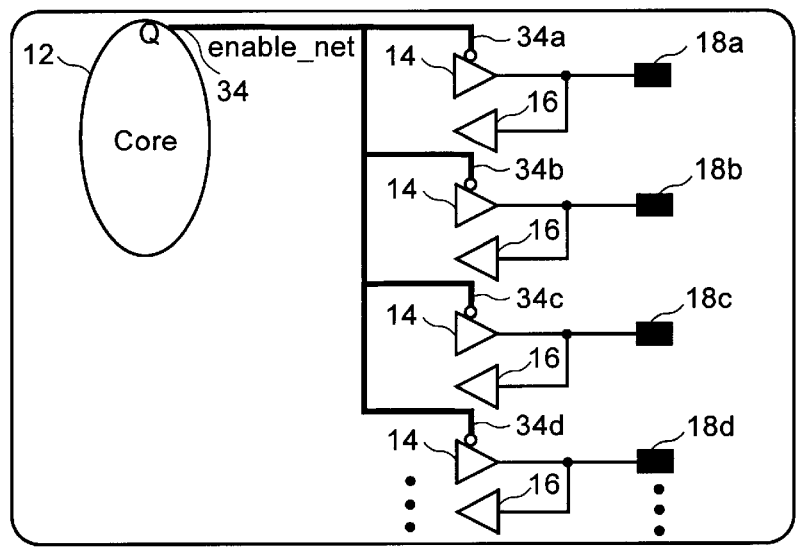
FIG. 1D illustrates another example in which the core communicates to multiple tri-state output buffers and input buffers in a non-JTAG mode enabled IC.
Figure 1E:
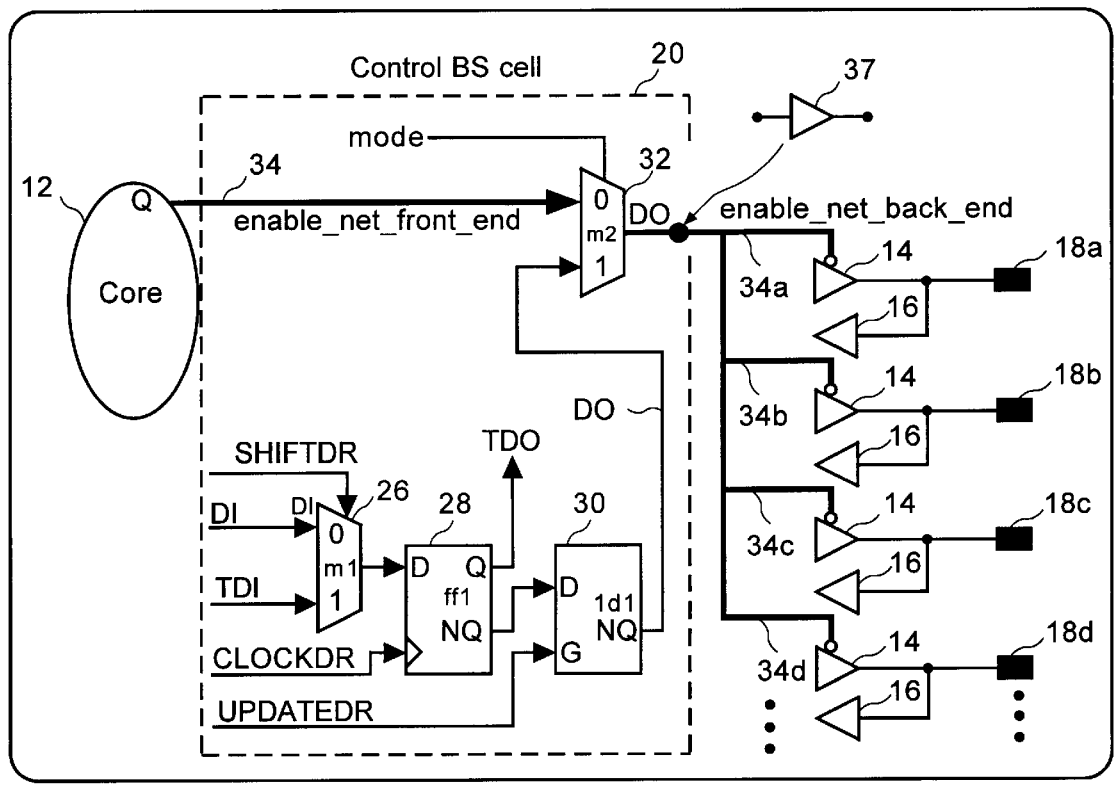
FIG. 1E is provided to illustrate the overdriving and timing disadvantages of prior art boundary scan cells.

For completeness, the control boundary scan cell 100 is shown driving the output signal (UPDR) 107 that is provided to each of the multiplexers 122 of each of the data output boundary scan cells 120. Each of the data output boundary scan cells 120 are then configured to communicate with the input of the tri-state output buffers 114 and associated control terminals. The outputs of the tri-state output buffers 114 then communicate to respective input/output pads 118. Although not shown in this example for simplicity, the typical JTAG design also includes input buffers coupled between the input/output pads 118 and associated input boundary scan cells (as shown in FIG. 1B).

Figure 5C:
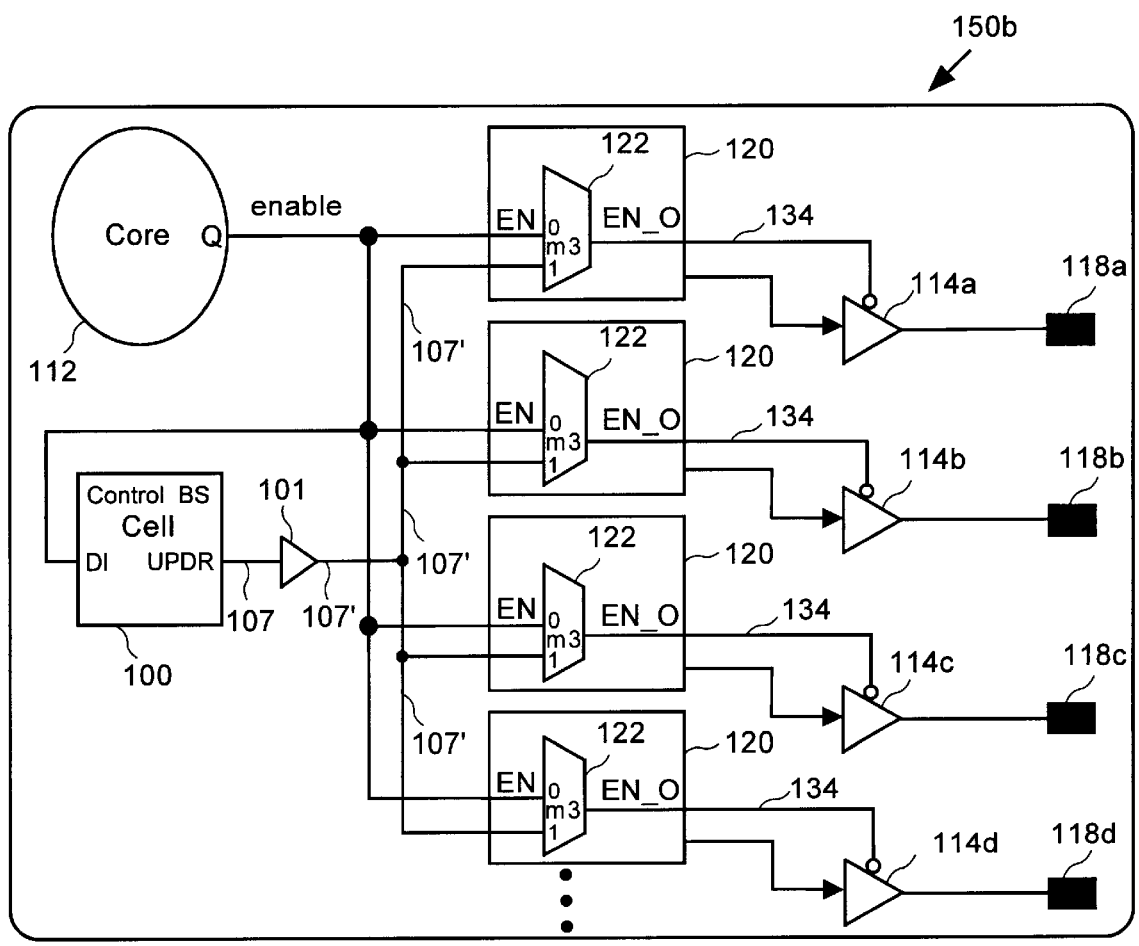
FIG. 5C illustrates another example of circuitry that incorporates boundary scan cells for multiple bit applications, in accordance with one embodiment of the present invention.

FIG. 5C illustrates another embodiment of circuitry 150b that incorporates boundary scan cells for multiple bit applications, in accordance with one embodiment of the present invention. In this embodiment, to achieve an increased driving strength during JTAG mode, a buffer 101 (e.g., a drive enhancing circuit) can be added at the output of the control boundary scan cell 100. In this manner, the signal 107 can be buffered to produce a signal 107' that is then communicated to each of the multiplexers 122 within the data output boundary scan cells 120. Because the buffer 101 is outside of the functional path, functional path timing will not be affected by the inclusion of this additional buffer.

Although the buffer 101 is shown as a single buffer gate, it should be well understood to those skilled in the art that any kind of buffering type logic circuitry may be implemented to produce the desired drive amplification 107' to the inputs of the multiplexers 122. Of course, if the control boundary scan cell 100 is already providing a signal 107 that has a sufficient drive during JTAG mode, this optional buffering may be omitted.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit design incorporating boundary scan cells having improved timing characteristics, comprising:

a control boundary scan cell configured to receive a core circuitry enable signal (Q) at a first multiplexer of the control boundary scan cell and generate an output signal from a latch of the control boundary scan cell;

a first data output boundary scan cell having a third multiplexer, the third multiplexer is configured to receive the core circuitry enable signal and the output signal from the latch of the control boundary scan cell and output a control signal, and the first data output boundary scan cell further includes a second multiplexer that is configured to generate a data output; and a first tri-state output buffer being configured to receive both the data output from the second multiplexer and the control signal from the third multiplexer.

2. An integrated circuit design incorporating boundary scan cells as recited in claim 1, further comprising:

a plurality of data output boundary scan cells coupled in parallel with the first data output boundary scan cell to produce a set of data output boundary scan cells, each of the set of data output boundary scan cells is configured to receive the core circuitry output signal, and output a selected data output and a selected control signal; and a plurality of tri-state output buffers coupled in parallel with the first tri-state output buffer to produce a set of tri-state output buffers, each of the set of tri-state output buffers is configured to receive an associated one of the selected data output and the selected control signal;

wherein the output signal from the latch of the control boundary scan cell is connected to a respective second multiplexer of each one of the set of data output boundary scan cells.

3. An integrated circuit design incorporating boundary scan cells as recited in claim 1, wherein the control boundary scan cell further comprises:

a flip flop circuit that is configured to receive an output of the first multiplexer, the first multiplexer further having a test data input and the flip flop circuit having a test data output.

4. An integrated circuit design incorporating boundary scan cells as recited in claim 3, wherein the third multiplexer and the second multiplexer are configured to receive a MODE control signal.

5. An integrated circuit design incorporating boundary scan cells as recited in claim 1, wherein the first data output boundary scan cell further comprises:

an input multiplexer configured to receive a data input (DI) signal, a test data input (TDI);

a flip flop circuit having a D input that is received from the input multiplexer, a test data output (TDO), and an inverted output NQ; and a latch configured to receive the inverted output NQ and an updated signal, and output an inverted signal to the second multiplexer, the second multiplexer further begin configured to receive the data input (DI) signal that was provided to the input multiplexer.

6. An integrated circuit design incorporating boundary scan cells as recited in claim 1, wherein the first tri-state output buffer has an output that is coupled to an input/output pad.

7. An integrated circuit design incorporating boundary scan cells as recited in claim 2, wherein the core circuitry output signal experiences a load on Q in a functional mode that is defined by N+1, where N is a load associated with the set of data output boundary scan cells, and where "1" is a load associated with the control boundary scan cell.

8. An integrated circuit design incorporating boundary scan cells as recited in claim 7, wherein the load on Q in the functional mode experiences a predictable increase of 1 due to a load of the first multiplexer of the control boundary scan cell.

9. An integrated circuit design incorporating boundary scan cells as recited in claim 1, wherein the incorporated boundary scan cells enable JTAG mode testing.

10. An integrated circuit design incorporating boundary scan cells as recited in claim 2, further comprising:

a drive strengthening circuit coupled between the output signal from the latch of the control boundary scan cell and an input of a second multiplexer of the set of data output boundary scan cells, the drive strengthening circuit configured to improve drive in a JTAG mode.

11. An integrated circuit design having boundary scan cells for enabling JTAG mode testing while providing a predictability in a load on Q in a functional mode, and while reducing adverse timing impacts, comprising:

a control boundary scan cell having an input that is connected to an enable signal that is communicated from a core of the integrated circuit design, the control boundary scan cell is further configured to generate an output signal; and a plurality of data output boundary scan cells, each of the plurality of data output boundary scan cells includes a multiplexer that has a first input that is connected to the enable signal and a second input that is connected to the output signal from the control boundary scan cell.

12. An integrated circuit design having boundary scan cells as recited in claim 11, further comprising:

a plurality of tri-state output buffers configured to receive a control signal and a data signal from an associated one of the plurality of data output boundary scan cells.

13. An integrated circuit design having boundary scan cells as recited in claim 11, further comprising:

a plurality of input/output pads are coupled to outputs of associated ones of the plurality of tri-state output buffers.

14. An integrated circuit design having boundary scan cells as recited in claim 11, wherein the input of the control boundary scan cell is a data input (DI), and the output signal of the control boundary scan cell is an UPDR signal.

15. An integrated circuit design having boundary scan cells as recited in claim 11, wherein the predictability in the load of Q in the functional mode is defined by N+1, where "N" is a load associated with the plurality of data output boundary scan cells and "1" is a load associated with the control boundary scan cell.

16. An integrated circuit design having boundary scan cells as recited in claim 11, further comprising:

a drive enhancing circuitry being coupled between the output of the control boundary scan cell and each of the plurality of data output boundary scan cells.

17. An integrated circuit design having boundary scan cells as recited in claim 16, wherein the drive enhancing circuitry increases a drive strength of the output of the control boundary scan cell when performing the JTAG mode testing.

18. A method for making an integrated circuit device having boundary scan cells for enabling JTAG mode testing while providing a predictability in a load on Q in a functional mode, and while reducing adverse timing impacts, the method comprising:

designing a control boundary scan cell having an input that is connected to an enable signal that is communicated from a core of the integrated circuit design, the control boundary scan cell is further configured to generate an output signal; and designing a plurality of data output boundary scan cells, each of the plurality of data output boundary scan cells includes a multiplexer that has a first input connected to the enable signal and a second input that is connected to the output signal from the control boundary scan cell.

19. A method for making an integrated circuit device having boundary scan cells as recited in claim 18, further comprising:

designing a plurality of tri-state output buffers configured to receive a control signal and a data signal from an associated one of the plurality of data output boundary scan cells.

20. A method for making an integrated circuit device having boundary scan cells as recited in claim 18, further comprising:

designing a plurality of input/output pads are coupled to outputs of associated ones of the plurality of tri-state output buffers.

21. A method for making an integrated circuit device having boundary scan cells as recited in claim 18, wherein the predictability in the load of Q in the functional mode is defined by N+1, where "N" is a load associated with the plurality of data output boundary scan cells and "1" is a load associated with the control boundary scan cell.

22. A method for making an integrated circuit device having boundary scan cells as recited in claim 18, further comprising:

integrating a drive enhancing circuitry between the output of the control boundary scan cell and each of the plurality of data output boundary scan cells.

23. A method for making an integrated circuit device having boundary scan cells as recited in claim 22, wherein the drive enhancing circuitry increases a drive strength of the output of the control boundary scan cell when performing the JTAG mode testing.

* * * * *